(12) United States Patent
Sato

(10) Patent No.: US 12,315,858 B2
(45) Date of Patent: May 27, 2025

(54) DISPLAY DEVICE

(71) Applicant: KYOCERA Corporation, Kyoto (JP)

(72) Inventor: Yohei Sato, Muko (JP)

(73) Assignee: KYOCERA Corporation, Kyoto (JP)

(*) Notice: Subject to any disclaimer, the term of this patent is extended or adjusted under 35 U.S.C. 154(b) by 0 days.

(21) Appl. No.: 18/565,443

(22) PCT Filed: May 12, 2022

(86) PCT No.: PCT/JP2022/020099
§ 371 (c)(1),
(2) Date: Nov. 29, 2023

(87) PCT Pub. No.: WO2022/255056
PCT Pub. Date: Dec. 8, 2022

(65) Prior Publication Data
US 2024/0258293 A1 Aug. 1, 2024

(30) Foreign Application Priority Data
May 31, 2021 (JP) ................. 2021-091579

(51) Int. Cl.
G09G 3/32 (2016.01)
H01L 25/16 (2023.01)

(52) U.S. Cl.
CPC ............ H01L 25/167 (2013.01); G09G 3/32 (2013.01); G09G 2300/0452 (2013.01); G09G 2320/0233 (2013.01); G09G 2320/0242 (2013.01); G09G 2330/08 (2013.01)

(58) Field of Classification Search
None
See application file for complete search history.

(56) References Cited

U.S. PATENT DOCUMENTS

2017/0061849 A1 3/2017 Matsueda et al.
2022/0406248 A1* 12/2022 Ju ..................... G11C 19/28

FOREIGN PATENT DOCUMENTS

JP 2017-49571 A 3/2017

* cited by examiner

Primary Examiner — Joseph R Haley
(74) Attorney, Agent, or Firm — Procopio, Cory, Hargreaves & Savitch LLP

(57) ABSTRACT

A display device includes a substrate including a mount surface, pixels arranged in a matrix on the mount surface and each including a first light emitter for normal driving and a second light emitter for redundant driving having a same emission characteristic as the first light emitter, and a drive controller. When the drive controller performs first redundant driving with a row being a redundant driving row and a row adjacent to the redundant driving row being a normal driving row, the first light emitter and the second light emitter in each pixel are arranged to satisfy a ratio of a second average distance to a first average distance being 0.8 to 1.2.

17 Claims, 6 Drawing Sheets

DISPLAY DEVICE

TECHNICAL FIELD

The present disclosure relates to a display device including two light emitters, such as light-emitting diodes (LEDs), having the same emission characteristics for each pixel.

BACKGROUND OF INVENTION

A known display device is described in, for example, Patent Literature 1.

CITATION LIST

Patent Literature

Patent Literature 1: Japanese Unexamined Patent Application Publication No. 2017-49571

SUMMARY

In an aspect of the present disclosure, a display device includes a substrate including a mount surface, a plurality of pixels arranged in a matrix on the mount surface and each of the plurality of pixels including a first light emitter for normal driving and a second light emitter for redundant driving having a same emission characteristic as the first light emitter, and a drive controller that selectively causes one of the first light emitter or the second light emitter to emit light. When the drive controller performs first redundant driving with a row in the matrix being a redundant driving row and a row adjacent to the redundant driving row being a normal driving row, the first light emitter and the second light emitter in the each of the plurality of pixels are arranged to satisfy a ratio of a second average distance to a first average distance being 0.8 to 1.2, where the first average distance is an average distance between first light emitters in adjacent rows when the first light emitter in the each of the plurality of pixels emits light, and the second average distance is an average distance between the first light emitters emitting light in the normal driving row and the second light emitters emitting light in the redundant driving row adjacent to the normal driving row. When the drive controller performs second redundant driving with a column in the matrix being a redundant driving column and a column adjacent to the redundant driving column being a normal driving column, the first light emitter and the second light emitter in the each of the plurality of pixels are arranged to satisfy a ratio of a fourth average distance to a third average distance being 0.8 to 1.2, where the third average distance is an average distance between first light emitters in adjacent columns when the first light emitter in the each of the plurality of pixels emits light, and the fourth average distance is an average distance between the first light emitters emitting light in the normal driving column and the second light emitters emitting light in the redundant driving column adjacent to the normal driving column.

In an aspect of the present disclosure, a display device includes a substrate including a mount surface, a plurality of pixels arranged in a matrix on the mount surface and each of the plurality of pixels including a first light emitter for normal driving and a second light emitter for redundant driving having a same emission characteristic as the first light emitter, and a drive controller that selectively causes one of the first light emitter or the second light emitter to emit light. When the drive controller performs first redundant driving with a row in the matrix being a redundant driving row and a row adjacent to the redundant driving row being a normal driving row, the first light emitter and the second light emitter in the each of the plurality of pixels are arranged to allow an average distance between first light emitters in adjacent rows when the first light emitter in the each of the plurality of pixels emits light to be substantially equal to an average distance between the first light emitters emitting light in the normal driving row and the second light emitters emitting light in the redundant driving row adjacent to the normal driving row. When the drive controller performs second redundant driving with a column in the matrix being a redundant driving column and a column adjacent to the redundant driving column being a normal driving column, the first light emitter and the second light emitter in the each of the plurality of pixels are arranged to allow an average distance between first light emitters in adjacent columns when the first light emitter in the each of the plurality of pixels emits light to be substantially equal to an average distance between the first light emitters emitting light in the normal driving column and the second light emitters emitting light in the redundant driving column adjacent to the normal driving column.

The display device according to the above aspects of the present disclosure can reduce bright lines and dark lines and improve display quality.

DESCRIPTION OF EMBODIMENTS

Figure 1:
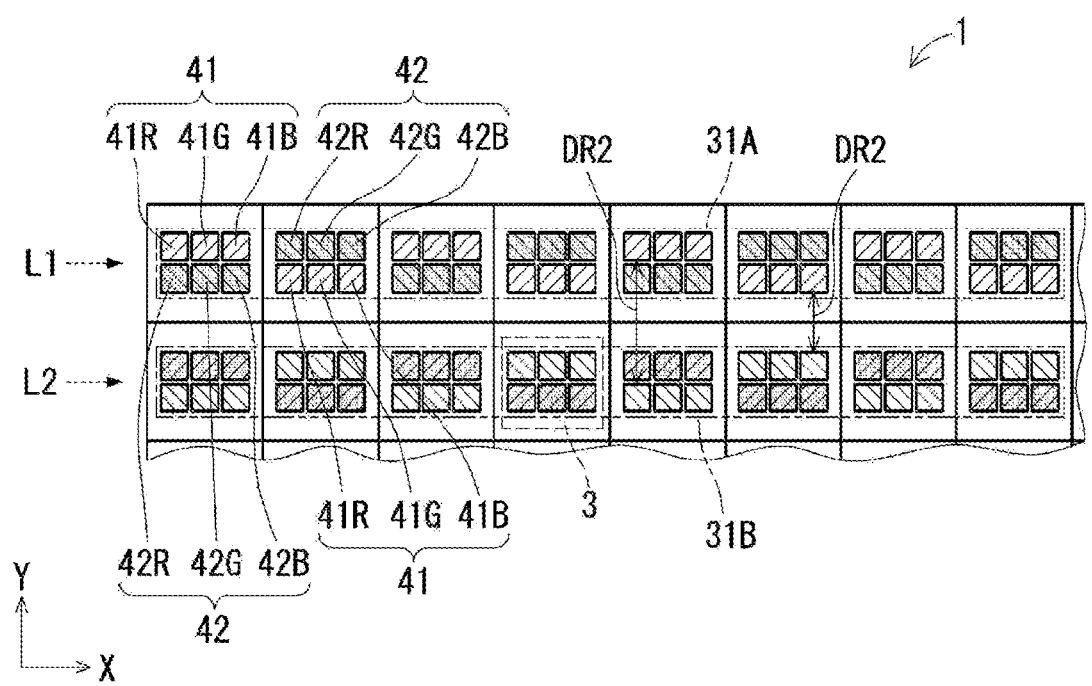
FIG. 1 is a schematic partial front view of a display device according to an embodiment of the present disclosure.

The objects, features, and advantages of the present disclosure will become more apparent from the following detailed description and the drawings.

The structure that forms the basis of a display device according to one or more embodiments of the present disclosure will now be described. A known display device includes multiple first pixels each including subpixels of three colors. Each subpixel includes one light emitter. Each first pixel thus includes three light emitters. The display device also includes multiple second pixels each including subpixels of three colors. The subpixels are arranged differently from the subpixels in a first pixel. The first pixels and the second pixels are alternately arranged in row and column directions. The known display device assigns a predetermined percentage of the luminance of a subpixel of a first color in a second pixel to a subpixel of the first color in a first pixel adjacent to the second pixel and drives the pixels to emit light, thus reducing color edges.

Another known display device includes two light emitters having the same emission characteristics for each pixel and can perform redundant driving. One of the light emitters is a first light emitter that normally emits light. The other light emitter is a second light emitter (also referred to as a backup light emitter or a light emitter for redundant driving) that emits light when the first light emitter is defective.

Patent Literature 1 does not describe redundant driving. The above display device that can perform redundant driving may include the first light emitter and the second light emitter arranged in the same pattern in each pixel, thus causing inconvenience described below. When the second light emitters in a pixel group in a specific row or column emit light, and the first light emitters in pixel groups in the other rows or columns emit light, some of the light emitters emitting light may have a non-uniform distance in the row direction (row-direction distance) or in the column direction (column-direction distance) between them. An area in which the light emitters emitting light have a shorter row-direction or column-direction distance between them than the light emitters in the other areas is more likely to be viewed as a bright line by a viewer of the display device. An area in which the light emitters emitting light have a longer row-direction or column-direction distance between them than the light emitters in the other areas is more likely to be viewed as a dark line by the viewer of the display device. In other words, non-uniformity may occur in the row-direction distances or the column-direction distances between the light emitters emitting light, thus lowering the display quality.

An display device according to one or more embodiments of the present disclosure will now be described with reference to the accompanying drawings. Each figure referred to below illustrates main components and other elements of a display device according to one or more embodiments. In the embodiments, the display device may include known components that are not illustrated, for example, circuit boards, wiring conductors, control integrated circuits (ICs), and large-scale integration (LSI) circuits.

In one or more embodiments of the present disclosure, a display device 1 includes first light emitters 41 and second light emitters 42 arranged to satisfy the ratio of a second average distance to a first average distance being 0.8 to 1.2 when a drive controller 5 performs a first redundant driving with one row in a matrix being a redundant driving row and rows adjacent to the redundant driving row being normal driving rows. The first average distance is an average distance between the first light emitters 41 in adjacent rows when the first light emitters 41 in multiple pixels 3 emit light. The second average distance is an average distance between the first light emitters 41 emitting light in the normal driving rows adjacent to the redundant driving row and the second light emitters 42 emitting light in the redundant driving row. This structure is less likely to have non-uniformity in the average distances in the column direction between the light emitters emitting light across the entire display. This reduces bright lines and dark lines appearing between adjacent rows. The display device 1 includes the first light emitters 41 and the second light emitters 42 arranged to satisfy the ratio of a fourth average distance to a third average distance being 0.8 to 1.2 when the drive controller 5 performs a second redundant driving with one column in a matrix being a redundant driving column and columns adjacent to the redundant driving column being normal driving columns. The third average distance is an average distance between the first light emitters 41 in adjacent columns when the first light emitters 41 in the multiple pixels 3 emit light. The fourth average distance is an average distance between the first light emitters 41 emitting light in the normal driving columns adjacent to the redundant driving column and the second light emitters 42 emitting light in the redundant driving column. This structure is less likely to have non-uniformity in the average distances in the row direction between the light emitters emitting light across the entire display. This reduces bright lines and dark lines appearing between adjacent columns.

In one or more embodiments of the present disclosure, another display device includes first light emitters 41 and second light emitters 42 arranged to have the first average distance and the second average distance substantially equal to each other when the first redundant driving is performed. In other words, the first average distance and the second average distance are approximate or equal to each other. For example, the ratio of the second average distance to the first average distance, or (the second average distance)/(the first average distance), may be 0.7 to 1.3, 0.8 to 1.2, 0.9 to 1.1, or 1. This structure with the first average distance and the second average distance being substantially equal to each other is less likely to have non-uniformity in the average distances in the column direction between the light emitters emitting light across the entire display. This reduces bright lines and dark lines appearing between adjacent rows.

In one or more embodiments of the present disclosure, another display device includes first light emitters 41 and second light emitters 42 arranged to have the third average distance and the fourth average distance substantially equal to each other when the second redundant driving is performed. In other words, the third average distance and the fourth average distance are approximate or equal to each other. For example, the ratio of the fourth average distance to the third average distance, or (the fourth average distance)/(the third average distance), may be 0.7 to 1.3, 0.8 to 1.2, 0.9 to 1.1, or 1. This structure with the third average distance and the fourth average distance being substantially equal to each other is less likely to have non-uniformity in the average distances in the row direction between the light emitters emitting light across the entire display. This reduces bright lines and dark lines appearing between adjacent columns.

In the first redundant driving, the second light emitters 42 in one row in a matrix emit light, and the first light emitters 41 in rows adjacent to the row emit light. The redundant driving row being the uppermost row or the lowermost row in a matrix is adjacent to a single normal driving row. The redundant driving row being a row other than the uppermost row and the lowermost row in a matrix is adjacent to a total of two normal driving rows, which are a row above the redundant driving row and a row below the redundant driving row. Not all the second light emitters 42 may emit light in the redundant driving row. For example, the second light emitters 42 in a half or more of the pixels 3 in the redundant driving row may emit light, and the first light emitters 41 in the rest of the pixels 3 may emit light. In the redundant driving row, the second light emitters 42 in every other pixel or in every two or more pixels may emit light.

In the second redundant driving, the second light emitters 42 in one column in a matrix emit light, and the first light emitters 41 in columns adjacent to the column emit light. The redundant driving column being the leftmost column or the rightmost column in a matrix is adjacent to a single normal driving column. The redundant driving column being a column other than the leftmost column and the rightmost column in a matrix is adjacent to two normal driving columns, which are a column at the left of the redundant driving column and a column at the right of the redundant driving column. Not all the second light emitters 42 may emit light in the redundant driving column. For example, the second light emitters 42 in a half or more of the pixels 3 in the redundant driving column may emit light, and the first light emitters 41 in the rest of the pixels 3 may emit light. In the redundant driving column, the second light emitters 42 in every other pixel or in every two or more pixels may emit light.

Figure 2:
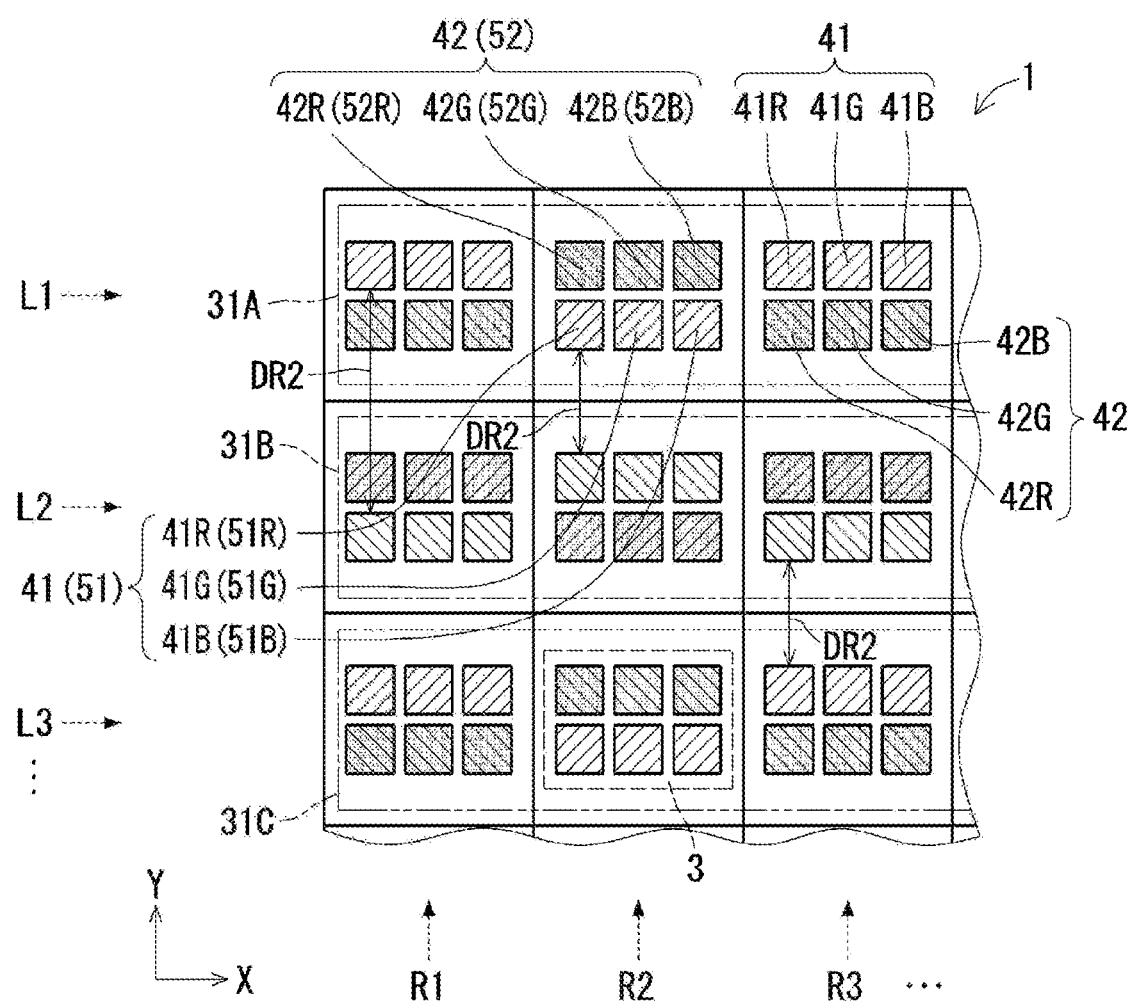
FIG. 2 is a partially enlarged schematic view of three by three pixels in the display device illustrated in FIG. 1.

For the first redundant driving, as illustrated in FIGS. 1 and 2, the pixels 3 include a first row pixel group in a first row L1 (first pixel row 31A) as a normal driving row, a second row pixel group in a second row L2 (second pixel row 31B) as a redundant driving row adjacent to the first row L1, and a third row pixel group in a third row L3 (third pixel row 31C) as a normal driving row adjacent to the second row. The ratio DRa2/DRa1 may be set to 0.8 to 1.2, where DRa1 is the first average distance being an average distance between the first light emitters 41 in adjacent rows when the drive controller 5 causes the first light emitters 41 in the pixels 3 to emit light, and DRa2 is the second average distance being an average distance between the first light emitters 41 emitting light and the second light emitters 42 emitting light in adjacent rows when the drive controller 5 causes the first light emitters 41 in the first row pixel group, the second light emitters 42 in the second row pixel group (corresponding to a pixel group in the redundant driving row), and the first light emitters 41 in the third row pixel group to emit light. The drive controller 5 causing the first light emitters 41 in the pixels 3 to emit light may cause the first light emitters 41 in all the pixels 3 to emit light, may cause the first light emitters 41 in adjacent multiple normal driving rows to emit light, or may cause the first light emitters 41 in adjacent multiple normal driving columns to emit light.

The display device 1 with the above structure produces the effects described below. When the first light emitter 41 in at least one pixel 3 in a specific row (e.g., the second row L2) is defective, the corresponding second light emitter 42 emits light. Thus, every pixel 3 emits light. The first light emitters 41 and the second light emitters 42 are arranged with the ratio of the second average distance DRa2 between the first light emitters 41 emitting light and the second light emitters 42 emitting light in adjacent rows to the first average distance DRa1 being 0.8 to 1.2. This structure is less likely to have non-uniformity in the average distances in the column direction between the light emitters emitting light across the entire display. This reduces bright lines and dark lines appearing between adjacent rows, thus allowing full-color high definition images to be displayed with high display quality.

As illustrated in FIGS. 1 and 2, the row direction in a matrix is referred to as X-direction, and the column direction as Y-direction. The first row L1, the second row L2, and the third row L3 may not be located at an uppermost portion or a lowermost portion of a matrix and may be located in the other portions of the matrix.

The ratio DRa2/DRa1 is set to satisfy $0.8 \le DRa2/DRa1 \le 1.2$. The second average distance DRa2, which is an average of distances DR2 (illustrated in FIGS. 1 and 2) between the first light emitters 41 emitting light and the second light emitters 42 emitting light in adjacent rows, is thus more likely to be equal to the first average distance DRa1 for the entire display. In other words, non-uniformity is less likely to occur in the average distances in the column direction between the light emitters emitting light across the entire display. The first average distance DRa1 for the entire display may be, but not limited to, about 5 to 200 μm. A range of values referred to herein as one value to another value intends to mean the two values being inclusive.

First Embodiment

FIG. 1 is a schematic partial front view of a display device 1 according to an embodiment of the present disclosure. FIG. 2 is a partially enlarged schematic view of three by three pixels in the display device 1 illustrated in FIG. 1. The components in the drawings and other figures for each embodiment are illustrated with exaggerated sizes, layer thicknesses, or areas for clarity and may not be limited to accurate scales.

In the present embodiment, the display device 1 includes a single panel including a substrate 2, multiple pixels 3, and a drive controller 5. The substrate 2 includes a mount surface 2a. The pixels 3 are arranged in a matrix in a row direction X and a column direction Y on the mount surface 2a of the substrate 2.

The pixels 3 are arranged in m rows and n columns (m and n are integers greater than or equal to 2) on the mount surface 2a. Each of the m×n pixels 3 includes a first light emitter 41 and a second light emitter 42 having the same emission characteristics as the first light emitter 41. The drive controller 5 selectively causes one of the first light emitter 41 or the second light emitter 42 in each of the m×n pixels 3 to emit light.

As illustrated in FIG. 2, the multiple pixels 3 include a first column R1 and a second column R2 adjacent to the first column R1. The first column R1 and the second column R2 are arranged repeatedly in the row direction to comprise the matrix. The first column R1 includes the pixels 3 (certain pixels) each including the first light emitter 41 and the second light emitter 42 arranged in the column direction in this order. The second column R2 includes the pixels 3 (other pixels) each including the second light emitter 42 and the first light emitter 41 arranged in the column direction in this order.

The m×n pixels 3 each include the first light emitter 41 mounted as a regular light emitter and the second light emitter 42 mounted as a redundant light emitter having the same emission characteristics as the regular light emitter. The same emission characteristics refer to the same emission wavelength and the same emission intensity for the same input current. The first light emitter 41 includes a red light emitter 41R for emitting red light, a green light emitter 41G for emitting green light, and a blue light emitter 41B for emitting blue light. The second light emitter 42 includes a red light emitter 42R for emitting red light, a green light emitter 42G for emitting green light, and a blue light emitter 42B for emitting blue light. The red light emitter 41R is included in a red subpixel 51R, and the red light emitter 42R in a red subpixel 52R. The green light emitter 41G is included in a green subpixel 51G, and the green light emitter 42G in a green subpixel 52G. The blue light emitter 41B is included in a blue subpixel 51B, and the blue light emitter 42B in a blue subpixel 52B.

In the present embodiment, the display device 1 includes, for each pixel 3, the second light emitter 42 for redundancy in addition to the regular first light emitter 41. When a regular first light emitter 41 is defective, the corresponding second light emitter 42 is driven to allow the pixel 3 to emit light. The pixels 3 in the first pixel row 31A each include six subpixels (two red subpixels, two green subpixels, and two blue subpixels). Similarly, the pixels 3 in the second pixel row 31B adjacent to the first pixel row 31A in the column direction (Y-direction) each include six subpixels 51R, 51G, 51B, 52R, 52G, and 52B. The first light emitters 41 are simply and collectively referred to as light emitters 41. The second light emitters 42 are simply and collectively referred to as light emitters 42. In FIGS. 1, 2, and 4 to 6, light emitters emitting light are hatched and colored in white, and light emitters emitting no light are hatched and colored in gray.

As illustrated in FIGS. 1 and 2, each pixel 3 includes the three subpixels 51R, 51G, and 51B arranged in the row direction X and the three subpixels 52R, 52G, and 52B also arranged in the row direction X.

The pixels 3 in the first row pixel group in the first pixel row 31A are arranged in the row direction X at a predetermined pixel pitch (e.g., about 50 to 500 μm). The same applies to the second pixel row 31B and the third pixel row 31C. The pixel pitch may be set to achieve a pixel density of, but not limited to, at least about 300 pixels per inch.

The light emitters 41 and 42 may be, for example, micro-light-emitting diodes (μLEDs). The light emitters 41 and 42 may be self-luminous light emitters such as organic LEDs (OLEDs) or semiconductor laser diodes (LDs). In the present embodiment, the light emitters are μLEDs. Each μLED mounted on an element-mounting portion of the mount surface 2a (illustrated in FIG. 3) may be rectangular in a plan view with each side having a length of about 1 to 100 μm inclusive, or about 5 to 20 μm inclusive.

Each pixel 3 includes an anode electrode, a cathode electrode, and the light emitters 41 and 42 electrically connected to the electrodes. Each pixel 3 also includes components such as a switching thin-film transistor (TFT) and a drive TFT for controlling, for example, the luminance and the lighting or non-lighting state of each of the light emitters 41 and 42. Each pixel 3 may include a pixel circuit including a complementary metal-oxide-semiconductor (CMOS) transfer gate, an inverter logic circuit (inverter), or a NOR circuit.

The substrate 2 (illustrated in FIG. 3) may be made of, for example, a glass material, a ceramic material, a resin material, a metal material, or a semiconductor material. Examples of the glass material include borosilicate glass, crystallized glass, quartz, and soda glass. Examples of the ceramic material include alumina ($Al_2O_3$), aluminum nitride (AlN), silicon nitride ($Si_3N_4$), zirconia ($ZrO_2$), and silicon carbide (SiC). Examples of the resin material include an epoxy resin, a polyimide resin, and a polyamide resin. Examples of the metal material include aluminum (Al), titanium (Ti), beryllium (Be), magnesium (Mg) (specifically, high-purity magnesium with a Mg content of 99.95% or higher), zinc (Zn), tin (Sn), copper (Cu), iron (Fe), chromium (Cr), nickel (Ni), and silver (Ag). The metal material may be an alloy material. Examples of the alloy material include an iron alloy mainly containing iron (a Fe—Ni alloy, a Fe—Ni—Co (cobalt) alloy, a Fe—Cr alloy, or a Fe—Cr—Ni alloy), duralumin, which is an aluminum alloy mainly containing aluminum (an Al—Cu alloy, an Al—Cu—Mg alloy, or an Al—Zn—Mg—Cu alloy), a magnesium alloy mainly containing magnesium (a Mg—Al alloy, a Mg—Zn alloy, or a Mg—Al—Zn alloy), titanium boride, and a Cu—Zn alloy. Examples of the semiconductor material include silicon (Si), germanium (Ge), and gallium arsenide (GaAs).

Figure 3:
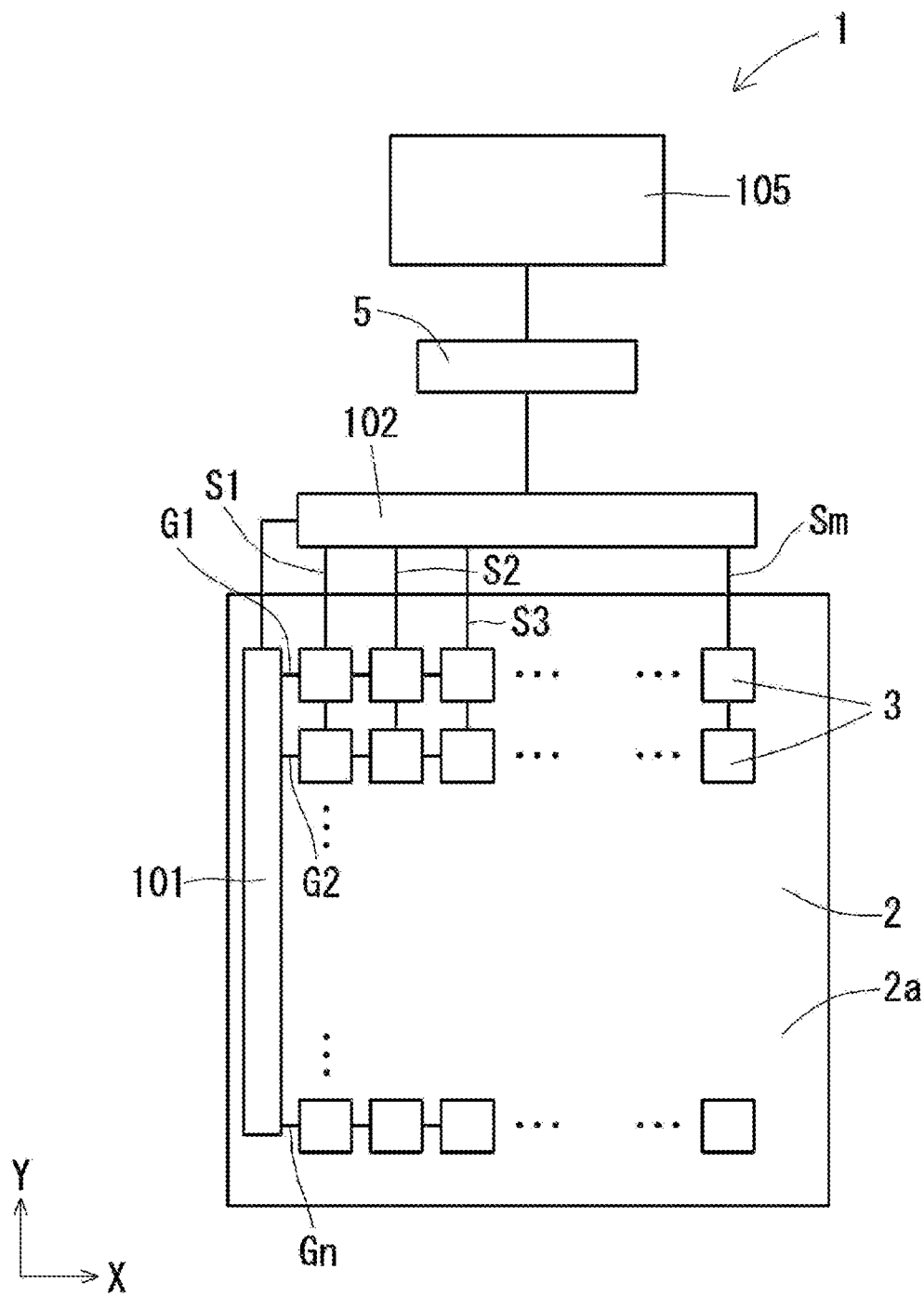
FIG. 3 is a block diagram of the display device according to the embodiment of the present disclosure, illustrating its basic structure.

FIG. 3 is a block diagram of the display device 1 according to the embodiment of the present disclosure, illustrating its basic structure. The display device 1 includes the substrate 2, the m×n pixels 3, and the drive controller 5. The m×n pixels 3 are arranged in a matrix in the row direction X and in the column direction Y intersecting with the row direction X on the mount surface 2a being one main surface of the substrate 2. The drive controller 5 controls the pixels 3 to emit light with the luminance corresponding to an image signal output from an image signal generator 105.

The display device 1 includes a pixel control circuit as the drive controller 5, the m×n pixels 3 arranged in a matrix at a predetermined pixel pitch on the mount surface 2a, m gate signal lines G1, G2, . . . , Gm−1, and Gm (hereafter referred to as G1 to Gm) as scanning lines on the mount surface 2a, n source signal lines S1, S2, . . . , Sn−1, and Sn (hereafter referred to as S1 to Sn), a gate signal generator 101, and a signal line drive circuit 102. The pixel control circuit may be implemented by, for example, a central processing unit (CPU). The m gate signal lines G1 to Gm may extend in the row direction X on the mount surface 2a, and the n source signal lines S1 to Sn may extend in the column direction. In other embodiments, the display device 1 may include n gate signal lines G1 to Gn extending in the column direction on the mount surface 2a and m source signal lines S1 to Sm extending in the row direction X. In an example structure described below, m gate signal lines G1 to Gm as the scanning lines extend in the row direction X on the mount surface 2a, and n source signal line S1 to Sn extend in the column direction.

The pixels 3 are in a selected state in response to gate signals (also referred to as pixel selection signals or scanning line signals) provided from the gate signal generator 101 through the m gate signal lines G1 to Gm. The pixels 3 in the selected state receive source signals (image signals) provided from the signal line drive circuit 102 through the n source signal lines S1 to Sn. The pixels 3 each have, for example, the structure described below. Each pixel 3 includes the switching TFT including a gate electrode connected to one of the gate signal lines G1 to Gm. The switching TFT includes a source electrode connected to one of the source signal lines S1 to Sn. The switching TFT includes a drain electrode connected to a gate electrode of the drive TFT. The drive TFT includes a source electrode connected to a first power supply terminal (VDD terminal). The drive TFT includes a drain electrode connected to anode terminals of the light emitters 41 and 42. The light emitters 41 and 42 each include a cathode terminal connected to a second power supply terminal (VSS terminal).

The pixel circuit and the light emitters 41 and 42 included in each pixel 3 operate in the manner described below. The pixel 3 located at an intersection of the gate signal line Gm and the source signal line Sn will be described. In response to receiving a gate signal from the gate signal line Gm at the gate electrode, the switching TFT can be conductive between the source and the drain and enters an on-state. The switching TFT in the on-state receives, at the source electrode, a source signal from the signal line drive circuit 102 through the source signal line Sn, and the source signal is input into the gate electrode of the drive TFT. A drive current generated based on a VDD voltage (a voltage lower than or equal to the VDD voltage) controlled based on the voltage amplitude (signal intensity) of the source signal is input from the drain electrode of the drive TFT into the anode terminal of the light emitter 41 or 42. The light emitter 41 or 42 emits light with the luminance corresponding to a value of the drive current.

The drive controller 5 may include, for example, a TFT and a wiring conductor on the substrate 2. The TFT may include a semiconductor film (also referred to as a channel) of, for example, amorphous silicon (a-Si) or low-temperature polycrystalline silicon (LTPS). The TFT may include three terminals, or specifically, a gate electrode, a source electrode, and a drain electrode. The TFT serves as a switching element that switches conduction and non-conduction between the source electrode and the drain electrode based on the voltage applied to the gate electrode. The drive controller 5 may be formed with a thin-film formation method such as chemical vapor deposition (CVD) and may include an external control unit such as a CPU. The drive controller 5 may be a software program stored in a storage such as a random-access memory (RAM) or a read-only memory (ROM) in a drive element, for example, an IC or an LSI circuit included in the image signal generator 105. The drive controller 5 may be a software program stored in a storage in a drive element separate from the image signal generator 105. The drive controller 5 may be a control circuit on a circuit board separate from the substrate 2.

The drive controller 5 controls each pixel 3. The drive controller 5 performs a first driving (normal driving) to drive the light emitter 41 or a second driving (redundant driving) to drive the light emitter 42 for each pixel 3. The first driving causes the first light emitter 41 to emit light and causes the second light emitter 42 not to emit light. The second driving causes the second light emitter 42 to emit light and causes the first light emitter 41 not to emit light.

Figure 4:
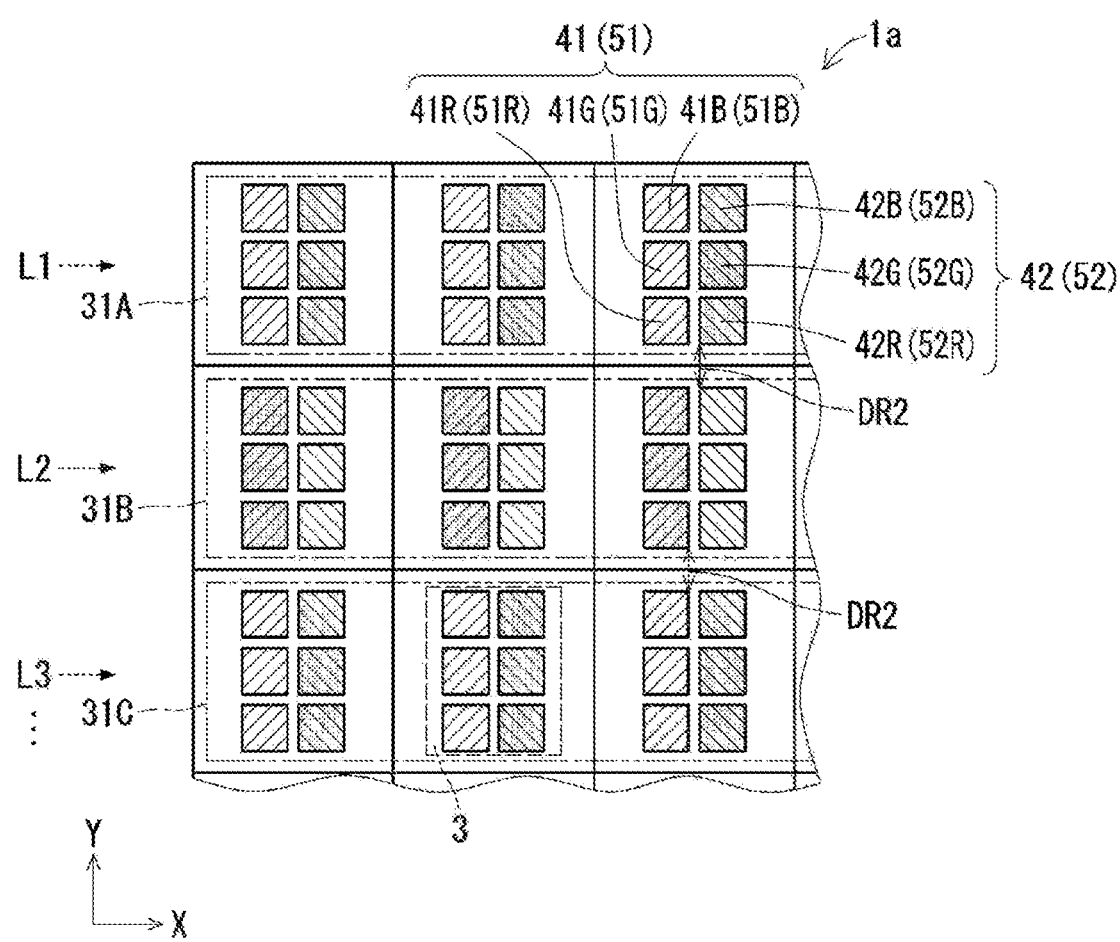
FIG. 4 is a partially enlarged schematic plan view of a display device according to another embodiment of the present disclosure.
Figure 5:
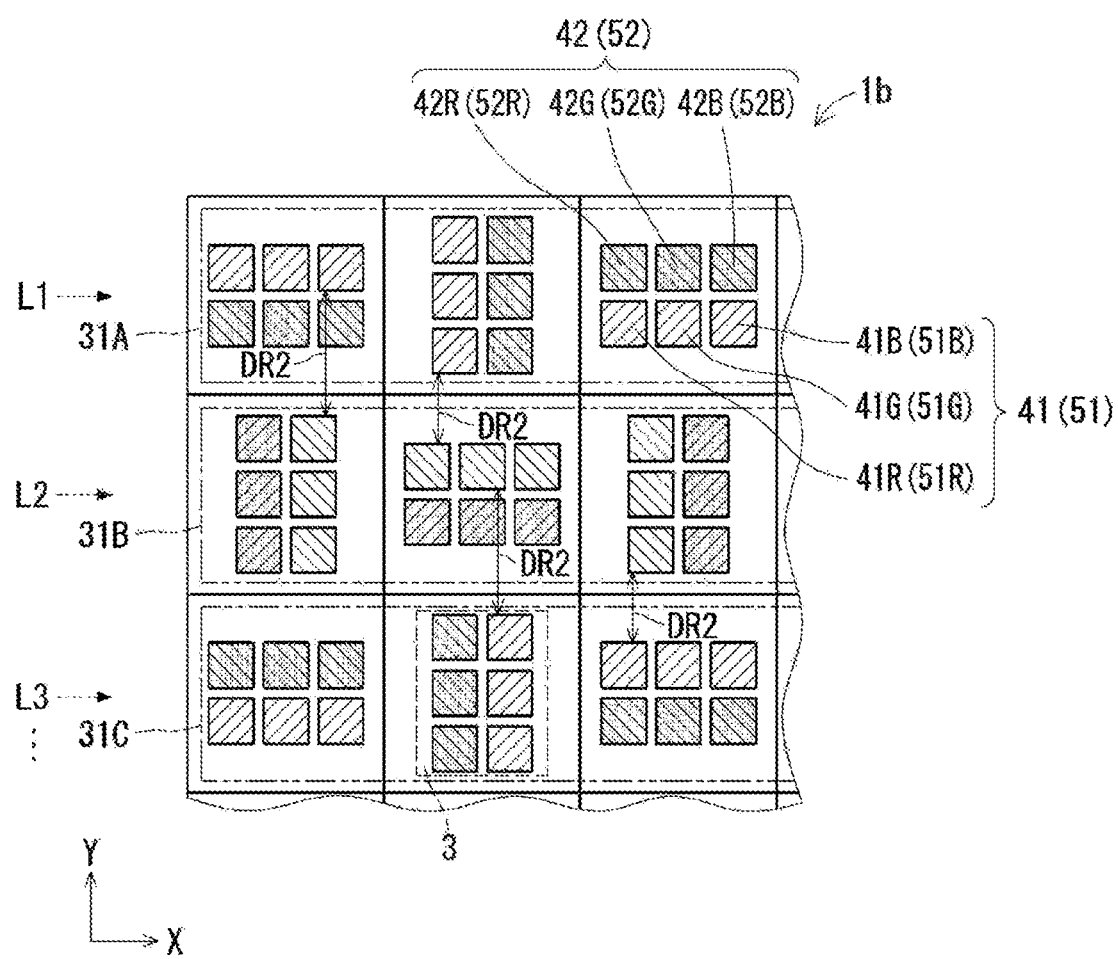
FIG. 5 is a partially enlarged schematic plan view of a display device according to another embodiment of the present disclosure.
Figure 6:
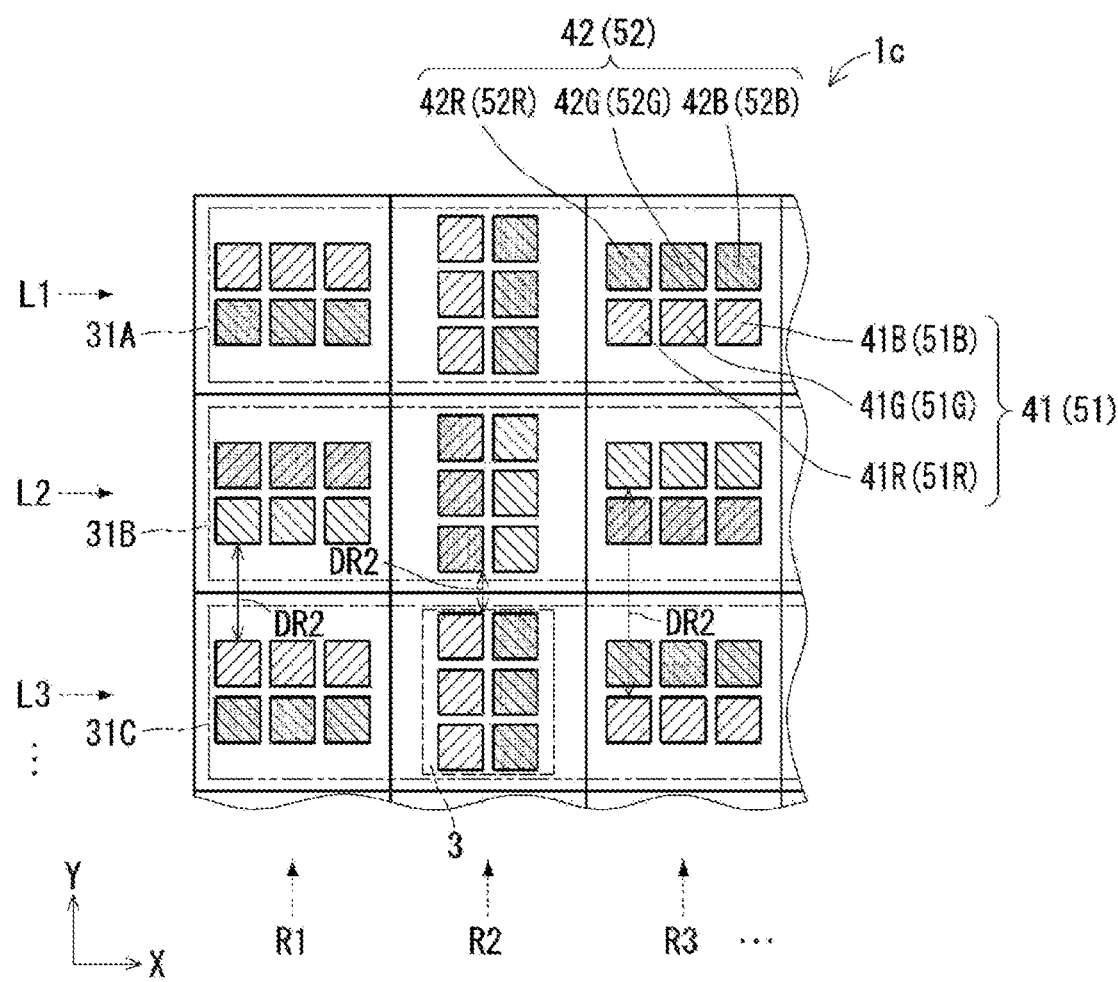
FIG. 6 is a partially enlarged schematic plan view of a display device according to another embodiment of the present disclosure.

As described later, the three adjacent subpixels 51R, 51G, and 51B and the three adjacent subpixels 52R, 52G, and 52B may be arranged in the row direction X (FIGS. 1 and 2) or in the column direction (FIG. 4) in each pixel 3, or may be arranged in the row direction X in some pixels 3 and in the column direction in the other pixels 3 (FIGS. 5 and 6).

In the embodiment of the present disclosure, the display device includes, for example, regular light emitters as the first light emitters 41 and light emitters for emitting light after switching to the redundant driving as the second light emitters 42. For different pixel arrangement patterns described above, when a first light emitter 41 is defective, the display device causes the corresponding second light emitter 42 to emit light. Thus, every pixel 3 emits light. The first light emitters 41 and the second light emitters 42 are arranged to satisfy the ratio of the second average distance DRa2 between the first light emitters 41 emitting light and the second light emitters 42 emitting light in adjacent rows to the first average distance DRa1 being 0.8 to 1.2. This structure is less likely to have non-uniformity in the average distances between the light emitters emitting light in adjacent rows across the entire display. This reduces bright lines and dark lines, thus allowing full-color high definition images to be displayed with high display quality.

In response to control command signals from the drive controller 5 to perform the first driving and the second driving, the signal line drive circuit 102 selectively causes either the first light emitters 41 or the second light emitters 42 to emit light for each row or column. The signal line drive circuit 102 may selectively cause either the first light emitter 41 or the second light emitter 42 to emit light for each pixel 3.

In the present embodiment, varying distances in the column direction between the light emitters 41 being driven (in other words, emitting light) in the first pixel row 31A and the light emitters 42 being driven in the second pixel row 31B adjacent to the first pixel row 31A in the column direction are averaged, thus reducing the likelihood that bright lines and dark lines are viewed by the viewer viewing an entire display image and improving the display quality.

Second Embodiment

FIG. 4 is a partially enlarged schematic plan view of a display device 1a according to another embodiment of the present disclosure. The same reference numerals denote the components corresponding to those in the above embodiments. In the display device 1a according to the present embodiment, multiple pixels 3 in rows L1, L2, and L3 each include the first light emitter 41 and the second light emitter 42 arranged in the row direction in this order. In this simple structure, the ratio of the second average distance DRa2 between the first light emitters 41 emitting light and the second light emitters 42 emitting light in adjacent rows to the first average distance DRa1 can be 0.8 to 1.2. In the example illustrated in FIG. 4, each pixel 3 includes the first light emitter 41 in its left portion and the second light emitter 42 in its right portion, but may include the first light emitter 41 in its right portion and the second light emitter 42 in its left portion.

The ratio DRa2/DRa1 is set to 0.8 to 1.2, where DRa1 is the first average distance between the first light emitters 41 emitting light in adjacent rows when the drive controller 5 causes the first light emitters 41 in the pixels 3 to emit light, and DRa2 is the second average distance between the first light emitters 41 emitting light and the second light emitters 42 emitting light in adjacent rows when the drive controller 5 causes the first light emitters 41 included in the first row pixel group in the first row L1, the second light emitters 42 included in the second row pixel group in the second row L2 (corresponding to the pixel group in the redundant driving row), and the first light emitters 41 included in the third row pixel group in the third row L3 to emit light. In other words, the second average distance DRa2 is equal or approximate to the first average distance DRa1.

Third Embodiment

FIG. 5 is a partially enlarged schematic plan view of a display device 1b according to another embodiment of the present disclosure. The same reference numerals denote the components corresponding to those in the above embodiments. In the display device 1b according to the present embodiment, multiple pixels 3 include a reference pixel 3 (the pixel 3 at the center in FIG. 5) including the first light emitter 41 and the second light emitter 42 arranged in a pattern in the row direction or in the column direction. A left pixel left to the reference pixel in the row direction includes the above pattern rotated clockwise or counterclockwise by a predetermined angle. A right pixel right to the reference pixel in the row direction includes the above pattern rotated by the predetermined angle in a direction opposite to the direction in which the left pixel is rotated. An upper pixel above the reference pixel in the column direction includes the above pattern rotated clockwise or counterclockwise by the predetermined angle. A lower pixel below the reference pixel in the column direction includes the above pattern rotated by the predetermined angle in a direction opposite to the direction in which the upper pixel is rotated.

The predetermined angle as a rotation angle may be 70 to 110 degrees. Angles outside this range are likely to cause non-uniformity in the average distances between the light emitters emitting light in adjacent rows. The predetermined angle may be 80 to 100 degrees.

In the display device 1b, when the second light emitters 42 are selected as the redundant light emitters by row after switching to the redundant driving, the ratio of the second average distance DRa2 between the selected first light emitters 41 and the selected second light emitters 42 in adjacent rows to the first average distance DRa1 is 0.8 to 1.2. The second average distance DRa2 is thus approximate or equal to the first average distance DRa1. This reduces the likelihood that bright lines and dark lines lower the display quality.

Fourth Embodiment

FIG. 6 is a partially enlarged schematic plan view of a display device 1c according to another embodiment of the present disclosure. The same reference numerals denote the components corresponding to those in the above embodiments. In the present embodiment, the display device 1c includes multiple pixels 3 including a first column R1, a second column R2 adjacent to the first column R1, and a third column R3 adjacent to the second column R2. The first column R1, the second column R2, and the third column R3 are arranged repeatedly to comprise the matrix. The first column R1 includes the pixels 3 (first pixels) each including the first light emitter 41 and the second light emitter 42 arranged in the column direction in this order. The second column R2 includes the pixels 3 (second pixels) each including the first light emitter 41 and the second light emitter 42 arranged in the row direction. The third column R3 includes the pixels 3 (third pixels) each including the second light emitter 42 and the first light emitter 41 arranged in the column direction in this order.

In the display device 1c, when the second light emitters 42 are selected as the redundant light emitters by row after switching to the redundant driving, the ratio of the second average distance DRa2 between the selected first light emitters 41 and the selected second light emitters 42 in adjacent rows to the first average distance DRa1 is 0.8 to 1.2. The second average distance DRa2 is thus approximate or equal to the first average distance DRa1. This reduces the likelihood that bright lines and dark lines lower the display quality.

The distance DR2 may be a distance between a side or an edge of a first light emitter 41 emitting light nearest a second light emitter 42 and a side or an edge of a second light emitter 42 emitting light nearest a first light emitter 41 in adjacent rows in a plan view. The distance DR2 may be a distance between a light-emitting portion (also referred to as a light-emitting point or a light-emitting center) of a first light emitter 41 emitting light and a light-emitting portion of a second light emitter 42 emitting light in adjacent rows in a plan view.

The drive controller 5 may perform the first redundant driving with normal driving rows and redundant driving rows arranged alternately in the matrix. In the structure in FIG. 2, for example, the drive controller 5 performs the first redundant driving with the first row L1 as a normal driving row, the second row L2 as a redundant driving row, and the third row L3 and subsequent rows as a normal driving row or a redundant driving row in the same or similar manner as the first row L1 and the second row L2. This structure reduces bright lines and dark lines appearing between adjacent rows and also causes dark points to be less visible when one or more first light emitters 41 malfunction during the use of the display device 1. The first light emitters 41 operate in the normal driving over a long period of time, and thus are more likely to malfunction than the second light emitters 42 during the use of the display device 1. The above structure is thus effective. The above structure may be used across the entire display or in a part of the display. A part of the display may be about 10 to 90%, about 50% or greater, or about 70 to 90% of the display.

The drive controller 5 may perform the first redundant driving with multiple normal driving rows and multiple redundant driving rows arranged alternately. For example, the drive controller 5 may perform the first redundant driving with two normal driving rows and two redundant driving rows arranged alternately.

When performing the first redundant driving with normal driving rows and redundant driving rows arranged alternately, the drive controller 5 may switch electrically the positions of the normal driving rows and the redundant driving rows at predetermined time intervals (e.g., one to ten frame periods). In the structure in FIG. 2, for example, the first row L1 as a normal driving row is switched to a redundant driving row after a predetermined period, and the second row L2 as a redundant driving row is switched to a normal driving row. After another predetermined period, the first row L1 is switched from a redundant driving row to a normal driving row, and the second row L2 is switched from a normal driving row to a redundant driving row. Such switching is repeated in driving. The third row L3 and subsequent rows are also driven to repeat the switching in the same or similar manner. This structure reduces bright lines and dark lines appearing between adjacent rows and also causes dark points to be less visible when one or more first light emitters 41 malfunction during the use of the display device 1. The above structure may be used across the entire display or in a part of the display. A part of the display may be about 10 to 90%, about 50% or greater, or about 70 to 90% of the display.

The display device 1 may include the first light emitters 41 and the second light emitters 42 arranged to satisfy the ratio of the fourth average distance to the third average distance being 0.8 to 1.2 when the drive controller 5 performs the second redundant driving with one column in a matrix being a redundant driving column and columns adjacent to the redundant driving column being normal driving columns. The third average distance is an average distance between the first light emitters 41 in adjacent columns when the first light emitters 41 in the pixels 3 emit light. The fourth average distance is an average distance between the first light emitters 41 emitting light in the normal driving columns adjacent to the redundant driving column and the second light emitters 42 emitting light in the redundant driving column.

More specifically, for the second redundant driving, the pixels 3 include a first column pixel group in the first column R1 as a normal driving column, a second column pixel group in the second column R2 as a redundant driving column adjacent to the first column R1, and a third column pixel group in the third column R3 as a normal driving column adjacent to the second column R2. The ratio DLa2/DLa1 is set to satisfy $0.8 \leq DLa2/DLa1 \leq 1.2$, where DLa1 is the third average distance being an average distance between the first light emitters 41 in adjacent columns when the drive controller 5 causes the first light emitters 41 in the multiple pixels 3 to emit light, and DLa2 is the fourth average distance being an average distance between the first light emitters 41 emitting light and the second light emitters 42 emitting light in adjacent columns when the drive controller 5 causes the first light emitters 41 in the first column pixel group, the second light emitters 42 in the second column pixel group, and the first light emitters 41 in the third column pixel group to emit light.

The display device with the above structure produces the effects described below. When the first light emitter 41 in at least one pixel 3 in a specific column (e.g., the second column R2) is defective, the corresponding second light emitter 42 emits light. Thus, every pixel 3 emits light. The first light emitters 41 and the second light emitters 42 are arranged to allow the third average distance DLa1 and the fourth average distance DLa2 between the first light emitters 41 emitting light and the second light emitters 42 emitting light in adjacent columns to be approximate or equal to each other. This structure is less likely to have non-uniformity in the distances DL2 between the light emitters emitting light in adjacent columns across the entire display. This reduces bright lines and dark lines appearing in the column direction.

The ratio DLa2/DLa1 may be set to satisfy $0.8 \leq DLa2/DLa1 \leq 1.2$. In this case, the fourth average distance DLa2, which is an average of the distances DL2 between the first light emitters 41 emitting light and the second light emitters 42 emitting light in adjacent columns, is more likely to be equal to the third average distance DLa1 for the entire display. In other words, non-uniformity is less likely to occur in the average distances between the light emitters emitting light in adjacent columns across the entire display. The third average distance DLa1 for the entire display may be, but not limited to, about 5 to 200 μm.

Fifth Embodiment

A fifth embodiment for performing the second redundant driving will be described. Multiple pixels 3 in the columns each include the first light emitter 41 and the second light emitter 42 arranged in the column direction in this order (not illustrated). In this simple structure, the ratio of the fourth average distance DLa2 between the first light emitters 41 emitting light and the second light emitters 42 emitting light in adjacent columns to the third average distance DLa1 is 0.8 to 1.2. The fourth average distance DLa2 can thus be approximate or equal to the third average distance DLa1. Each pixel 3 may include the first light emitter 41 in its upper portion and the second light emitter 42 in its lower portion, but may include the first light emitter 41 in its lower portion and the second light emitter 42 in its upper portion.

Sixth Embodiment

A sixth embodiment for performing the second redundant driving will be described. Multiple pixels 3 include the first row L1 and the second row L2 adjacent to the first row L1. The first row L1 and the second row L2 are arranged repeatedly. The first row L1 includes the pixels 3 each including the first light emitter 41 and the second light emitter 42 arranged in the row direction in this order. The second row L2 includes the pixels 3 each including the second light emitter 42 and the first light emitter 41 arranged in the row direction in this order. In this case, when the first light emitter 41 in at least one pixel 3 in a specific column (e.g., the second column R2) is defective, the corresponding second light emitter 42 emits light. Thus, every pixel 3 emits light. The first light emitters 41 and the second light emitters 42 are arranged to allow the third average distance DLa1 and the fourth average distance DLa2 between the light emitters emitting light in adjacent columns to be approximate or equal to each other. This structure is less likely to have non-uniformity in the average distances between the light emitters emitting light in adjacent columns across the entire display. This reduces bright lines and dark lines appearing in the column direction.

Seventh Embodiment

A seventh embodiment for performing the second redundant driving will be described. Multiple pixels 3 include a reference pixel 3 including the first light emitter 41 and the second light emitter 42 arranged in a pattern in the row direction or in the column direction. A left pixel left to the reference pixel in the row direction includes the above pattern rotated clockwise or counterclockwise by a predetermined angle. A right pixel right to the reference pixel in the row direction includes the above pattern rotated by the predetermined angle in a direction opposite to the direction in which the left pixel is rotated. An upper pixel above the reference pixel in the column direction includes the above pattern rotated clockwise or counterclockwise by the predetermined angle. A lower pixel below the reference pixel in the column direction includes the above pattern rotated by the predetermined angle in a direction opposite to the direction in which the upper pixel is rotated. This structure is not illustrated.

The predetermined angle as a rotation angle may be 70 to 110 degrees. Angles outside this range are likely to have non-uniformity in the average distances between the light emitters emitting light in adjacent columns. The predetermined angle may be 80 to 100 degrees.

In this display device, when the second light emitters 42 are selected as the redundant light emitters by column after switching to the redundant driving, the ratio of the fourth average distance DLa2 between the selected first light emitters 41 and the selected second light emitters 42 in adjacent columns to the third average distance DLa1 is 0.8 to 1.2. The fourth average distance DLa2 is thus approximate or equal to the third average distance DLa1. This reduces the likelihood that bright lines and dark lines lower the display quality.

Eighth Embodiment

An eighth embodiment for performing the second redundant driving will be described. Multiple pixels 3 include the first row L1, the second row L2 adjacent to the first row L1, and the third row L3 adjacent to the second row L2. The first row L1, the second row L2, and the third row L3 are arranged repeatedly. The first row L1 includes the pixels 3 each including the first light emitter 41 and the second light emitter 42 arranged in the row direction in this order. The second row L2 includes the pixels 3 each including the first light emitter 41 and the second light emitter 42 arranged in the column direction. The third row L3 includes the pixels 3 each including the second light emitter 42 and the first light emitter 41 arranged in the row direction in this order.

In this display device, when the second light emitters 42 are selected as the redundant light emitters by column after switching to the redundant driving, the ratio of the fourth average distance DLa2 between the selected first light emitters 41 and the selected second light emitters 42 in adjacent columns to the third average distance DLa1 is 0.8 to 1.2. The fourth average distance DLa2 is thus approximate or equal to the third average distance DLa1. This reduces the likelihood that bright lines and dark lines lower the display quality.

The drive controller 5 may perform the second redundant driving with normal driving columns and redundant driving columns arranged alternately. In the structure in FIG. 6, for example, the drive controller 5 performs the second redundant driving with the first column R1 as a normal driving column, the second column R2 as a redundant driving column, and the third column R3 and subsequent columns arranged as a normal driving column or a redundant driving column in the same or similar manner as the first column R1 and the second column R2. This structure reduces bright lines and dark lines appearing between adjacent columns and also causes dark points to be less visible when one or more first light emitters 41 malfunction during the use of the display device 1. The first light emitters 41 operate in the normal driving over a long period of time, and thus are more likely to malfunction than the second light emitters 42 during the use of the display device 1. The above structure is thus effective. The above structure may be used across the entire display or in a part of the display. A part of the display may be about 10 to 90%, about 50% or greater, or about 70 to 90% of the display.

The drive controller 5 may perform the second redundant driving to cause multiple normal driving columns and multiple redundant driving columns to be arranged alternately. For example, the drive controller 5 may perform the driving to cause two normal driving columns and two redundant driving columns to be arranged alternately.

When performing the second redundant driving with normal driving columns and redundant driving columns arranged alternately, the drive controller 5 may switch electrically the positions of the normal driving columns and the redundant driving columns at predetermined time intervals (e.g., one to ten frame periods). In the structure in FIG. 6, for example, the first column R1 as a normal driving column is switched to a redundant driving row after a predetermined period, and the second column R2 as a redundant driving column is switched to a normal driving column. After another predetermined period, the first column R1 is switched from a redundant driving column to a normal driving column, and the second column R2 is switched from a normal driving column to a redundant driving column. Such switching is repeated in driving. The third column R3 and subsequent columns are also driven to repeat the switching in the same or similar manner. This structure reduces bright lines and dark lines appearing between adjacent columns and also causes dark points to be less visible when one or more first light emitters 41 malfunction during the use of the display device 1. The above structure may be used across the entire display or in a part of the display. A part of the display may be about 10 to 90%, about 50% or greater, or about 70 to 90% of the display.

Although the embodiments of the present disclosure have been described in detail, the present disclosure is not limited to the embodiments described above, and may be changed or modified in various manners without departing from the spirit and scope of the present disclosure. The components described in the above embodiments may be entirely or partially combined as appropriate unless any contradiction arises. For example, multiple display devices 1, 1a, and 1b according to any of the embodiments of the present disclosure may be joined together to form a composite display device (multi-display) by joining the side portions of adjacent display devices with, for example, an adhesive or screws.

The display device according to the embodiments of the present disclosure can reduce bright lines and dark lines and improve display quality.

INDUSTRIAL APPLICABILITY

In one or more embodiments of the present disclosure, the display device can be used in various electronic devices. Such electronic devices include automobile route guidance systems (car navigation systems), ship route guidance systems, aircraft route guidance systems, indicators for instruments in vehicles such as automobiles, instrument panels, smartphones, mobile phones, tablets, personal digital assistants (PDAs), video cameras, digital still cameras, electronic organizers, electronic books, electronic dictionaries, personal computers, copiers, terminals for game devices, television sets, product display tags, price display tags, programmable display devices for industrial use, car audio systems, digital audio players, facsimile machines, printers, automatic teller machines (ATMs), vending machines, medical display devices, digital display watches, smartwatches, guidance display devices installed in stations or airports, and signage (digital signage) for advertisement.

REFERENCE SIGNS 1, 1a, 1b, 1c display device
2 substrate
2a mount surface
3 pixel
5 drive controller
31A first pixel row
31B second pixel row
41, 41R, 41G, 41B first light emitter
42, 42R, 42G, 42B second light emitter
51R, 51G, 51B; 52R, 52G, 52B subpixel
DR2 distance between light emitters emitting light in adjacent rows
L1 first row
L2 second row
L3 third row
R1 first column
R2 second column
R3 third column
X row direction
Y column direction

The invention claimed is:

1. A display device, comprising:
a substrate including a mount surface;
a plurality of pixels arranged in a matrix on the mount surface, each of the plurality of pixels including a first light emitter for normal driving and a second light emitter for redundant driving, the second light emitter having a same emission characteristic as the first light emitter; and
a drive controller configured to selectively cause one of the first light emitter or the second light emitter to emit light,
wherein when the drive controller performs first redundant driving with a row in the matrix being a redundant driving row and a row adjacent to the redundant driving row being a normal driving row, the first light emitter and the second light emitter in the each of the plurality of pixels are arranged to satisfy a ratio of a second average distance to a first average distance being 0.8 to 1.2, where the first average distance is an average distance between first light emitters in adjacent rows when the first light emitter in the each of the plurality of pixels emits light, and the second average distance is an average distance between the first light emitters emitting light in the normal driving row and the second light emitters emitting light in the redundant driving row adjacent to the normal driving row, or
when the drive controller performs second redundant driving with a column in the matrix being a redundant driving column and a column adjacent to the redundant driving column being a normal driving column, the first light emitter and the second light emitter in the each of the plurality of pixels are arranged to satisfy a ratio of a fourth average distance to a third average distance being 0.8 to 1.2, where the third average distance is an average distance between first light emitters in adjacent columns when the first light emitter in the each of the plurality of pixels emits light, and the fourth average distance is an average distance between the first light emitters emitting light in the normal driving column and the second light emitters emitting light in the redundant driving column adjacent to the normal driving column.

2. The display device according to claim 1, wherein
when the first redundant driving is performed, the plurality of pixels includes a first row pixel group in a first row as the normal driving row, a second row pixel group in a second row as the redundant driving row adjacent to the first row, and a third row pixel group in a third row as another normal driving row adjacent to the second row, and
a ratio DRa2/Dra1 is set to satisfy $0.8 \leq DRa2/Dra1 \leq 1.2$,
where DRa1 is the first average distance being an average distance, in a column direction, between the first light emitters emitting light in adjacent rows when the drive controller causes the first light emitter in each of the plurality of pixels to emit light, and
DRa2 is the second average distance being an average distance, in a column direction, between the first light emitters emitting light and the second light emitters emitting light in adjacent rows when the drive controller causes first light emitters in the first row pixel group, second light emitters in the second row pixel group, and first light emitters in the third row pixel group to emit light.

3. The display device according to claim 2, wherein
the each of the plurality of pixels in each row of the matrix includes the first light emitter and the second light emitter arranged in a row direction in an order of the first light emitter and the second light emitter.

4. The display device according to claim 2, wherein
the plurality of pixels includes a first column and a second column adjacent to the first column, the first column and the second column are arranged repeatedly to comprise the matrix, the first column includes certain pixels of the plurality of pixels each including the first light emitter and the second light emitter arranged in the column direction in an order of the first light emitter and the second light emitter, and the second column includes other pixels of the plurality of pixels each including the second light emitter and the first light emitter arranged in the column direction in an order of the second light emitter and the first light emitter.

5. The display device according to claim 2, wherein
the plurality of pixels includes
a reference pixel including the first light emitter and the second light emitter arranged in a pattern in a row direction or in the column direction,
a left pixel left to the reference pixel in the row direction, the left pixel including the pattern rotated clockwise or counterclockwise by a predetermined angle,
a right pixel right to the reference pixel in the row direction, the right pixel including the pattern rotated by the predetermined angle in a direction opposite to a direction in which the left pixel is rotated,
an upper pixel above the reference pixel in the column direction, the upper pixel including the pattern rotated clockwise or counterclockwise by the predetermined angle, and
a lower pixel below the reference pixel in the column direction, the lower pixel including the pattern rotated by the predetermined angle in a direction opposite to a direction in which the upper pixel is rotated.

6. The display device according to claim 5, wherein
the predetermined angle is 70 to 110 degrees.

7. The display device according to claim 2, wherein
the plurality of pixels includes a first column, a second column adjacent to the first column, and a third column adjacent to the second column, the first column, the second column, and the third column are arranged repeatedly to comprise the matrix, the first column includes first pixels of the plurality of pixels each including the first light emitter and the second light emitter arranged in the column direction in an order of the first light emitter and the second light emitter, the second column includes second pixels of the plurality of pixels each including the first light emitter and the second light emitter arranged in a row direction, and the third column includes third pixels of the plurality of pixels each including the second light emitter and the first light emitter arranged in the column direction in an order of the second light emitter and the first light emitter.

8. The display device according to claim 1, wherein
the drive controller is configured to perform the first redundant driving with the normal driving row and the redundant driving row arranged alternately in the matrix.

9. The display device according to claim 8, wherein
the drive controller is configured to switch electrically positions of the normal driving row and the redundant driving row at a predetermined time interval.

10. The display device according to claim 1, wherein
when the second redundant driving is performed,
the plurality of pixels includes a first column pixel group in a first column as the normal driving column, a second column pixel group in a second column as the redundant driving column adjacent to the first column, and a third column pixel group in a third column as another normal driving column adjacent to the second column, and
a ratio DLa2/DLa1 is set to satisfy $0.8 \leq DLa2/DLa1 \leq 1.2$,
where DLa1 is the third average distance being an average distance, in a row direction, between the first light emitters emitting light in adjacent columns when the drive controller causes the first light emitter in each of the plurality of pixels to emit light, and
DLa2 is the fourth average distance being an average distance, in a row direction, between the first light emitters emitting light and the second light emitters emitting light in adjacent columns when the drive controller causes first light emitters in the first column pixel group, second light emitters in the second column pixel group, and first light emitters in the third column pixel group to emit light.

11. The display device according to claim 10, wherein
the each of the plurality of pixels in each column of the matrix includes the first light emitter and the second light emitter arranged in the column direction in an order of the first light emitter and the second light emitter.

12. The display device according to claim 10, wherein
the plurality of pixels includes a first row and a second row adjacent to the first row, the first row and the second row are arranged repeatedly to comprise the matrix, the first row includes certain pixels of the plurality of pixels each including the first light emitter and the second light emitter arranged in the row direction in an order of the first light emitter and the second light emitter, and the second row includes other pixels of the plurality of pixels each including the second light emitter and the first light emitter arranged in the row direction in an order of the second light emitter and the first light emitter.

13. The display device according to claim 10, wherein the plurality of pixels includes
- a reference pixel including the first light emitter and the second light emitter arranged in a pattern in the row direction or in the column direction,
- a left pixel left to the reference pixel in the row direction, the left pixel including the pattern rotated clockwise or counterclockwise by a predetermined angle,
- a right pixel right to the reference pixel in the row direction, the right pixel including the pattern rotated by the predetermined angle in a direction opposite to a direction in which the left pixel is rotated,
- an upper pixel above the reference pixel in the column direction, the upper pixel including the pattern rotated clockwise or counterclockwise by the predetermined angle, and
- a lower pixel below the reference pixel in the column direction, the lower pixel including the pattern rotated by the predetermined angle in a direction opposite to a direction in which the upper pixel is rotated.

14. The display device according to claim 13, wherein the predetermined angle is 70 to 110 degrees.

15. The display device according to claim 10, wherein the plurality of pixels includes a first row, a second row adjacent to the first row, a third row adjacent to the second row, the first row, the second row, and the third row are arranged repeatedly to comprise the matrix, the first row includes first pixels of the plurality of pixels each including the first light emitter and the second light emitter arranged in the row direction in an order of the first light emitter and the second light emitter, the second row includes second pixels of the plurality of pixels each including the first light emitter and the second light emitter arranged in the column direction, and the third row includes third pixels of the plurality of pixels each including the second light emitter and the first light emitter arranged in the row direction in an order of the second light emitter and the first light emitter.

16. The display device according to claim 10, wherein the drive controller is configured to perform the second redundant driving with the normal driving column and the redundant driving column arranged alternately in the matrix.

17. The display device according to claim 16, wherein the drive controller is configured to switch electrically positions of the normal driving column and the redundant driving column at a predetermined time interval.

* * * * *